US011232610B2

United States Patent
Nickel et al.

(10) Patent No.: US 11,232,610 B2
(45) Date of Patent: Jan. 25, 2022

(54) GENERATING A QUANTITATIVE PARAMETER MAP FROM MAGNETIC RESONANCE (MR) DATA

(71) Applicant: Siemens Healthcare GmbH, Erlangen (DE)

(72) Inventors: Marcel Dominik Nickel, Herzogenaurach (DE); Manuel Schneider, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 64 days.

(21) Appl. No.: 16/885,483

(22) Filed: May 28, 2020

(65) Prior Publication Data

US 2020/0380736 A1 Dec. 3, 2020

(30) Foreign Application Priority Data

May 28, 2019 (DE) .......................... 102019207805.2

(51) Int. Cl.
*G06T 11/00* (2006.01)
*G06T 7/00* (2017.01)

(52) U.S. Cl.
CPC .......... *G06T 11/005* (2013.01); *G06T 7/0012* (2013.01); *G06T 11/008* (2013.01); *G06T 2207/10088* (2013.01)

(58) Field of Classification Search
None
See application file for complete search history.

(56) References Cited

U.S. PATENT DOCUMENTS

2020/0049783 A1 2/2020 Nickel et al.

OTHER PUBLICATIONS

Peterson, Pernilla et al. "Simultaneous Quantification of Fat Content and Fatty Acid Composition Using MR Imaging" Magnetic Resonance in Medicine; vol. 69; No. 3; pp. 688-697; 2013 // DOI: 10.1002/mrm.24297.
Leporq, Benjamin et al. "Hepatic Fat Fraction and Visceral Adipose Tissue Fatty Acid Composition in Mice: Quantification with 7.0T MRI" Magnetic Resonance in Medicine; vol. 76; No. 2; pp. 510-518; 2016 // DOI: 10.1002/mrm.25895.
Schneider, Manuel et al. "Accurate fatty acid composition estimation of adipose tissue in the abdomen based on bipolar multi-echo MRI", Magnetic Resonance in Medicine, vol. 81, pp. 2330-2346, 2018, DOI: 10.1002/mrm.27557.
Schneider, Manuel et al. "Triglyceride Saturation Estimation using Phase- and Amplitude-Modulated Bipolar MRI" Proc Intl. Soc. Mag Reson. Med 27 (Apr. 26, 2019) 1021.

*Primary Examiner* — Vu Le
*Assistant Examiner* — Courtney Joan Nelson
(74) *Attorney, Agent, or Firm* — Schiff Hardin LLP

(57) ABSTRACT

Techniques are disclosed for generating a quantitative parameter map from MR data. A specified signal model is adjusted to measured MR data. The signal model contains a time-dependent phase evolution map that specifies a respective separate phase evolution for each echo in a multi-echo sequence used to generate the MR data. Provision is also made for an image region that is to be represented to be divided up into a plurality of pixel fields, which include a plurality of pixels in each case. For all these pixel fields, at least the phase evolution for each echo is assumed to be equal for all the pixels in the respective pixel field, so as to achieve stability of the adjustment of the signal model to the MR data.

6 Claims, 3 Drawing Sheets

GENERATING A QUANTITATIVE PARAMETER MAP FROM MAGNETIC RESONANCE (MR) DATA

CROSS-REFERENCE TO RELATED APPLICATIONS

The present application claims the benefit of the filing date of German patent application no. DE 102019207805.2, filed on May 28, 2019, the contents of which are incorporated herein by reference in their entirety.

TECHNICAL FIELD

The present disclosure relates to techniques for generating a quantitative parameter map from magnetic resonance data by means of a specified signal model.

BACKGROUND

Magnetic resonance (MR) imaging is an established imaging method. Conventional magnetic resonance imaging provides qualitative or relative measurement values or corresponding images or image data, by means of which only relative conditions for intensities, for instance, can be detected. However, it would be desirable instead to have corresponding absolute data or images, which provide or allow quantitative details.

Therefore, some techniques include modeling the properties of a respective examination subject under MR imaging by means of a signal model that adjusts the signal model to measured MR data in each case. The problem with this is, however, that only limited knowledge is available about the respective examination subject, and with a viable outlay only a limited number of parameters in the respective signal model can be varied or adjusted, and a whole range of assumptions that in many respects have proved not to be correct or not accurate enough are incorporated into typical signal models. The latter is demonstrated, for example, by the resulting artifacts, image inhomogeneities and suchlike. In addition, existing approaches often rely on the use of specific MR sequences and k-space trajectories, i.e. specific acquisition types or acquisition patterns.

In the publication "Accurate fatty acid composition estimation of adipose tissue in the abdomen based on bipolar multi-echo MRI" by M. Schneider et al., published in Magn Reson Med. 2019; 81:2330-2346, DOI:10.1002/mrm.27557, a technique is proposed for jointly estimating disruptive factors and parameters for fat saturation. To this end, multi-echo GRE acquisitions are adjusted to a signal model, with noise propagation characteristics being said to be improved by using a smoke extraction technique, and taking into account eddy current-induced phase discrepancies.

SUMMARY

The object of the present disclosure is to facilitate improved quantitative signal modeling for MR imaging. This object is achieved according to the various embodiments of the disclosure, the figures, and the claims.

A method according to the disclosure serves to generate at least one quantitative parameter map, in particular from a plurality of parameter maps, by means of magnetic resonance data relating to an examination subject. The examination subject in this context can be for example a patient, a partial region of a patient, or virtually any subject available and suitable for magnetic resonance imaging. The magnetic resonance data can be or include e.g., data measured using a magnetic resonance unit, that is, a magnetic resonance tomograph (MRT), measured MR data, or further-processed data derived therefrom, for example MR images reconstructed in a conventional or known manner. Here, the parameter map may be, for example, a fatty acid map for different types of saturation of fats, a fat fraction map, or suchlike. Different types of saturation of fats in this context are, for example, saturated fatty acids (SFAs), mono-unsaturated fatty acids (MUFAs) and poly-unsaturated fatty acids (PUFAs). In this context, the parameter map is therefore comparable, for example, with a conventional water map.

One method step in the method embodiment according to the disclosure includes the acquisition of magnetic resonance data that characterize or represent the examination subject, by means of a multi-echo MR sequence. A multi-echo GRE sequence (GRE=gradient echo), for example, in which following an RF excitation pulse, a plurality of echoes are generated in each case by reversing the gradient or readout direction, may be used as this multi-echo sequence. The acquisition of the magnetic resonance data in this context can mean or include, for example, the measurement or recording thereof by means of a magnetic resonance unit (MR unit) or equally well the readout or retrieval thereof from a data memory.

In a further method step in the method embodiment according to the disclosure, a signal model is specified (e.g. calculated and/or stored), which models a magnetic resonance response signal (MR signal), from the examination subject. As described in the introduction, such signal models are known in principle and contain, for example, terms for fat and water fractions and also one or a plurality of phase terms.

In a further method step in the method embodiment according to the disclosure, the signal model or parameters thereof are adjusted, that is, are fitted to the magnetic resonance data acquired. To this end, for example, a specified least squares method can be used, that is for instance, a specified cost function that can be minimized in order to achieve a best-possible agreement of the signal model with the magnetic resonance data. Here, the generic specified signal model is individualized for the respective situation or the respective patient, such that it provides specific results accordingly.

In a further method step in the method embodiment according to the disclosure, the magnetic resonance response signal is calculated for an image region made up of a plurality of pixels by means of the adjusted signal model in order to generate the parameter map. In other words, therefore, a signal equation for example, which is specified as part of the signal model, is run, solved, or evaluated by means of a data processing facility. Here, the image region can correspond to a region of the respective examination subject or a section thereof that is covered or described by the magnetic resonance data that has been acquired. Pixels in the context of the present disclosure can be two-dimensional pixels or three-dimensional voxels.

Provision is made according to the disclosure for the signal model to contain a time-dependent phase evolution map, which is generated or derived from the magnetic resonance data acquired, and which specifies a respective separate phase evolution for at least three echoes, in particular for each echo. Generation of this phase evolution map can therefore be a further method step in the method according to the disclosure. Likewise, the phase evolution map can also be specified, however, and be acquired for implementing the method, likewise by the data processing facility, for example. The echoes described in the phase evolution map are the echoes used or considered for recording the magnetic resonance data that has been acquired.

The disclosure therefore makes provision for a set or a number of parameters in the signal model, in particular of possible phase variations, to be extended compared with conventional signal models by authorizing a separate phase evolution for each echo acquired. This can lead to a comparatively high number of parameters in the present signal model, since for example three to four echoes can be acquired after each RF excitation pulse, and a plurality of such RF excitation pulses can be used for recording the entire magnetic resonance data. The problem with this is that, according to the existing level of knowledge, the adjustment is unstable and ultimately worse due to there being such a large set of parameters to be adjusted in the signal model. Therefore, the approach pursued so far has been, in principle, to reduce the number of parameters to be adjusted via additional measures. For instance, in known signal models, for example, only two phases have been authorized. Disadvantageously, this leads to such a simplified signal model supplying statements of only limited reliability that are only realistic to a limited extent.

To solve this problem, provision is made according to the embodiments of the disclosure for the image region to be divided or subdivided into a plurality of pixel fields (patches) that each includes a plurality of pixels. For all these pixel fields, in each case at least the phase evolution for each echo is then assumed to be equal for all the pixels in the respective pixel field. In other words, the problem of unstable fitting due to the large number of parameters is compensated by having an evaluation ensue on a pixel field basis or a patch basis. The rationale for this according to the embodiments of the disclosure is the additional assumption that, spatially, the phase evolutions of the echoes only vary slightly, that is, considered spatially, they are smooth at least on the pixel fields scale, and therefore a multi-resolution approach can be pursued. The latter means that, for different steps or details of the present proposed method or of the signal model, different resolutions or granularities are used. The signal model therefore correlates, in each case, MR signals via the echoes and in a spatial region (the pixel fields). Here, quantitative parameters are also used. These quantitative parameters can be available, that is set out or contained, in the signal model itself. Likewise, these quantitative parameters can, however, be extracted, that is, be determined, from other model parameters in the signal model. This applies, for example, to a fat fraction that is calculable from water- and fat-signals or parameters in the signal model, MUFAs, PUFAs, and suchlike.

It is recognized in the present disclosure that this additional assumption is physically motivated and justified and, through the combination of the echo-individual phase evolution and the identical treatment, consideration or evaluation of the pixels in one pixel field in each case, an improved signal model or an improved result can be achieved overall, ultimately, that is, an improved parameter map. In addition, it has transpired experimentally that the method proposed here functions more robustly than conventional approaches and moreover, is more generally applicable. For instance, the present method does not, for example, rely on bipolar acquisition of the underlying magnetic resonance data, but can also be successfully applied on the basis of other k-space trajectories.

Unlike conventional water maps, for example, for the quantitative parameter map that is to be determined here, more echoes, that is more detailed magnetic resonance data, can be acquired in order to obtain an adequate spectral resolution. Moreover, the model-based post-processing of the magnetic resonance data on complex data should ensue, that is complex-valued input data should be supplied to the signal model. This is advantageous since the phase evolutions can depend on the spectrum in a very sensitive manner. These increased requirements can, however, typically be met comfortably using the magnetic resonance units available nowadays and corresponding data processing facilities.

Due to the fact that, for each echo, a separate phase factor is provided or authorized in the signal model and these phase factors therefore describe a development of the phase over time, advantageously actual effects and behavior patterns that occur in real time in the respective examination subject can be modeled in more detail and more accurately than is possible with conventional signal models. For instance, with conventional signal models, for example, neither eddy current effects nor time-dependent variations of the $B_0$ field can be modeled adequately enough, yet this is facilitated by the present method according to the embodiments of the disclosure. The spatial alignment of the corresponding values across one pixel field in each case does indeed likewise represent a simplification of the signal model which, however, causes significantly fewer errors, that is, significantly fewer deviations from reality in the model or model results than the aforementioned limitation of the authorized phases to a total of two, for example, for all the echoes together. Through the equalization on a pixel field basis, the signal model or the method according to the disclosure that are proposed here are manageable, however, since for example, the phase evolution is assumed to be constant within one pixel field in each case, that is, is at an equal level for all the pixels in the respective pixel field and therefore is adjusted as a single common value, that is, can be fitted.

As a whole, therefore, the basic concept underlying the embodiments of the present disclosure is that, by means of the phase model proposed here, which is extended compared with the prior art, potential phase discrepancies between echoes of the same polarity, that is, also between a plurality of even echoes and/or between a plurality of uneven echoes, corresponding to the positive or negative readout gradient, can also be detected. This is achieved by authorizing a separate phase evolution for each echo. On the other hand, existing models can typically only model an average discrepancy between echoes from the positive or negative readout gradient, and are therefore less flexible than the signal model proposed here. The greater flexibility of the signal model or method according to the embodiments of the disclosure is accompanied by a comparatively greater number of parameters to be determined, which can, however, be calculated, that is handled, for example by means of the proposed multi-resolution approach. Here, echo-dependent phase discrepancy maps are in each case assumed to be equal for all the pixels in the respective pixel field. This is physically motivated by the fact that such phase maps are assumed to be spatially only slow to vary, that is, are assumed to be smooth, and therefore can be calculated with a lower resolution. The other spatially variable parameters in the signal model, for example a water signal-parameter W, a fat signal-parameter F, a relaxation map R2*, fractions of the various fatty acids, and suchlike are calculated to a higher resolution. These parameters are therefore also calculated inside a pixel field as spatially variable.

The size of the pixel fields can be expressed, for example, as a number of pixels or as an extent or size of the pixel fields in the image region or in the corresponding MR image having any suitable pixel field size of any suitable number of pixels. For example, a pixel field can have a size of 7×7 pixels or 1×1 cm.

In an advantageous embodiment of the present disclosure, further parameters in the signal model are also assumed to be equal in each case for all of the pixel fields, in each case for all the pixels in a pixel field, that is, on a pixel field basis. Such parameters can be, for example, T1-, T2- or eddy current effects, a magnetic field strength or a field homogeneity and/or suchlike. In particular, these further parameters can likewise be included or shown in the phase evolution map. The time- or echo-dependent phase evolution map can therefore compensate for various phase-influencing effects or influences such as, for example, initial phases of water- and fat fractions, $B_0$-inhomogeneities, inaccuracies in the gradient fields and/or suchlike. For these effects or values too, only one single common value is therefore assumed or evaluated in each of the pixel fields. This can advantageously contribute to a further improved stability when adjusting the signal model to the magnetic resonance data and to a reduced computation effort and hence, accordingly, to a reduction in the time required.

In a further advantageous embodiment of the present disclosure, the magnetic resonance data is recorded by means of a monopolar acquisition method. In this way, inaccuracies or undesirable switching effects or transient effects that could possibly occur with a bipolar acquisition method when switching the gradient- or readout direction can be avoided. The present disclosure can indeed be used with a bipolar acquisition method, but it is a particular advantage of the present disclosure that, due to the improved robustness and flexibility of the method according to the disclosure, magnetic resonance data acquired in a monopolar manner can likewise be used as the basis for generating the quantitative parameter map since this is often not possible for conventional methods or signal models.

In a further advantageous embodiment of the present disclosure, a fat composition of the examination subject is modeled by means of the signal model, the signal model being given or based on the MR signal equation 1 as follows:

$$S_q(t_n) = (W_q + c(ndb_q, nmidb_q, t_n) F_q) e^{i\phi_q(t_n)} e^{-R_{2,q}^* t_n} \qquad \text{Eqn. 1:}$$

Here, the index q denotes a respective pixel or voxel, $t_n$ n=1 ... N denotes the discrete echo times, $W_q$ denotes a location-dependent real value water signal parameter, $F_q$ denotes a location-dependent real value fat signal-parameter, c( ... ) denotes a fat model expressed by saturation state parameters, a number $ndb_q$ of double bonds, and a number $nmidb_q$ of methylene-interrupted double bonds, $\phi_q(t_n)$ denotes the echo time-dependent phase evolution map, and $R_{2,q}^*$ denotes a transverse relaxation map.

For the fat model c( ... ), different assumptions can be made, for example regarding the lengths and/or types of fats occurring. Thus, for representing and modeling human patients, it can be assumed, for example, that only fatty acids with a chain length of 20 to 40 occur, and also that only such fats occur that are at most twice methylene interrupted. Basically, such fat models are known. Therefore, a known fat model can be used and optionally adjusted for use in the signal model that is presently provided.

In theoretical perfect or idealized MR imaging, the first bracket in the above signal Eqn. 1 with the water and fat signal parameters $W_q$, $F_q$ would in principle be adequate for the modeling. In practice, however, the exponential phase factors that are ultimately due to impurities, disruptive influences, or deviations from theoretical ideal assumptions are necessary to achieve a sufficiently accurate and realistic modeling. These disruptive effects can be, for example, the aforementioned further parameters or effects. Thus, for example, even a deviation of the actual $B_0$-field strength from a nominally provided value in the region of a few ppm can lead to off-resonance distortions, which could lead to phase effects or phase errors in the modeling. For example, later echoes in an echo train or echoes recorded later within an MR sequence could have a higher frequency, that is, rotate more quickly the magnetic moments that prompt them, something which is not taken into account in conventional signal models by assuming and applying the same phase or the same phase factor for all the echoes.

The method embodiments according to the disclosure can in particular be entirely or partly computer-implemented. Accordingly, a further aspect of the present disclosure is a computer program or computer program product (e.g. a non-transitory computer-readable medium) that includes commands or control instructions which, when executed by one or more processors and/or a computer, cause the one or more processors, computer, or component thereof to carry out at least one variant or embodiment variant of the method according to the disclosure, in particular automatically or partly automatically. A data processing facility of a magnetic resonance unit, a data processing facility connected to a magnetic resonance unit, a local (on premise) server, a remote server (computer center, cloud server) or suchlike can be used, for example, as the computer (or the one or more processor may form part of such example components) to run the computer program and/or executable instructions according to the embodiments of the disclosure. The computer program according to the disclosure can be part of a comprehensive program or program code. For example, a user interface can be provided, via which a respective user can operate or adjust the method that is encoded or implemented by the computer program.

Thus, aspects of the present disclosure include both the computer program and a suitable computer-readable storage medium, on which at least one embodiment variant of the computer program according to the disclosure may be stored.

A further aspect of the present disclosure is a magnetic resonance unit (or magnetic resonance imager), which may be implemented for instance as a magnetic resonance tomography unit or a magnetic resonance system, which has a measurement facility for recording magnetic resonance data and a computer-assisted data processing facility. The measurement facility can include for instance an array of magnetic coils, a corresponding signal generation facility, an amplifier, the controls thereof and/or suchlike. The data processing facility includes for its part a computer-readable storage medium according to the disclosure and a processor and/or control computer connected thereto to run the computer program or program code stored on the computer-readable storage medium. The signal model described in connection with the method according to the disclosure can be stored on the computer-readable storage medium.

Altogether, therefore, the magnetic resonance unit embodiments according to the disclosure can be equipped or configured in particular to carry out each of the method embodiments according to the disclosure. Accordingly, the magnetic resonance data mentioned herein in connection with the magnetic resonance unit embodiments and the aforementioned data processing facility can be for instance the magnetic resonance data or the corresponding data processing facility mentioned in connection with the method embodiments according to the disclosure. The magnetic resonance unit embodiments according to the disclosure can therefore have the properties or features mentioned in connection with the method embodiments according to the disclosure, or the other aspects of the present disclosure. The method embodiments according to the disclosure can therefore be an operating method for operating the magnetic resonance unit according to the disclosure or part of such an operating method.

The properties and developments of the methods according to the disclosure set out in the aforementioned and hereinafter, of the computer program according to the disclosure, of the computer-readable storage medium according to the disclosure, and of the magnetic resonance unit according to the disclosure and the corresponding advantages are in each case mutually interchangeable and transferable by analogy between these aspects of the present disclosure. The disclosure therefore also includes such developments of the aspects of the present disclosure that comprise embodiments which, to avoid unnecessary redundancy, are not explicitly described in the respective combination or are described separately for each aspect of the disclosure.

BRIEF DESCRIPTION OF THE DRAWINGS/FIGURES

Further features, details and advantages of the present disclosure will emerge from the description that follows of preferred exemplary embodiments and by means of the figures. The figures show:

DETAILED DESCRIPTION

The exemplary embodiments explained hereinafter are preferred embodiment variants of the disclosure. In the exemplary embodiments, the components of the embodiment variants described each represent individual features of the disclosure that are to be considered independently of each other, which each also further develop the disclosure independently of each other and therefore also individually or in a combination, other than that shown, are to be seen as a component of the disclosure. Furthermore, the embodiment variants described can also be completed by further features of the disclosure that have already been described.

In the figures, elements that are identical or identical in function or correspond with one another are each denoted by the same reference signs.

Figure 1:
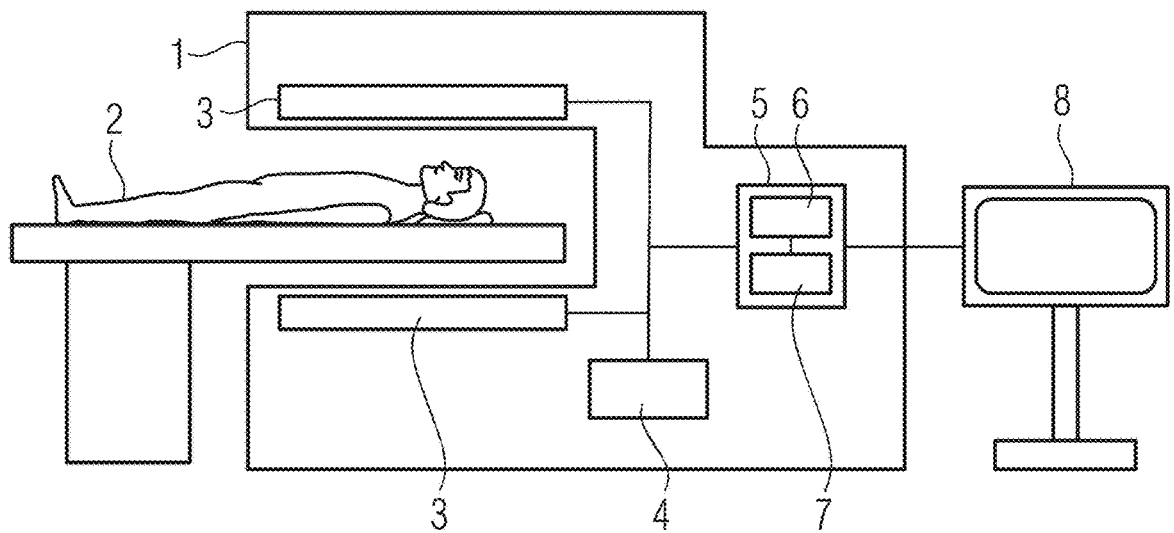
FIG. 1 illustrates a schematic side view of an example magnetic resonance unit, in accordance with various embodiments of the present disclosure.

FIG. 1 shows a schematic side view of a magnetic resonance (MR) unit. MR unit (or MR scanner or MR imager) 1 serves in the present example for imaging a patient 2, who is arranged here by way of example lying on a patient table at least partly in a recording or imaging region of the MR unit 1. Arranged around this recording region, the MR unit 1 includes in the present example a coil array 3, indicated schematically here in simplified form, for generating electromagnetic fields in the recording region and for measuring respective response signals from the patient 2.

The MR unit 1 includes in the present case a signal generation facility (or signal generation circuitry) 4, likewise indicated here in simplified form, which is connected to the coil arrangement 3. The signal generation facility 4 can include, for example, a signal generator, an amplifier, a control device and/or suchlike.

In the present case, the MR unit 1 also comprises a data processing facility (or data processor circuitry) 5, which is likewise connected here via appropriate wiring to the coil array 3 and/or to the signal generation facility 4. Accordingly, the data processing facility 5 can acquire measured data generated using the coil array 3 and the signal generation facility 4, which represent or characterize the patient 2 and are referred to hereinafter as MR data, via an appropriate interface.

The data processing facility 5 for its part includes at least one processor 6—for example a microprocessor, a microchip- or (micro-) controller and/or hardware wiring—and a data memory 7 (e.g. a non-transitory computer-readable medium) connected thereto. The data processing facility 5 can be equipped, for example, to process the MR data into a corresponding MR image and also a quantitative parameter map for the respective patient 2 or a respective imaging or image region.

Data, that is, for example, the MR image or the quantitative parameter map, generated by the data processing facility 5 can be stored for further processing or use in the data memory 7, for example, and/or issued by a display 8 that is likewise shown here. The display 8 can be part of the MR unit 1 or merely connected thereto.

In the present example, an operating or control program, that is a corresponding program code, which is executable by the processor 6, can be stored in the data memory 7, in particular for the automatic or semi-automatic execution of one or more method embodiments as described herein for generating the quantitative parameter map using the MR data for the patient 2, who is serving here by way of example as an examination subject.

Figure 2:
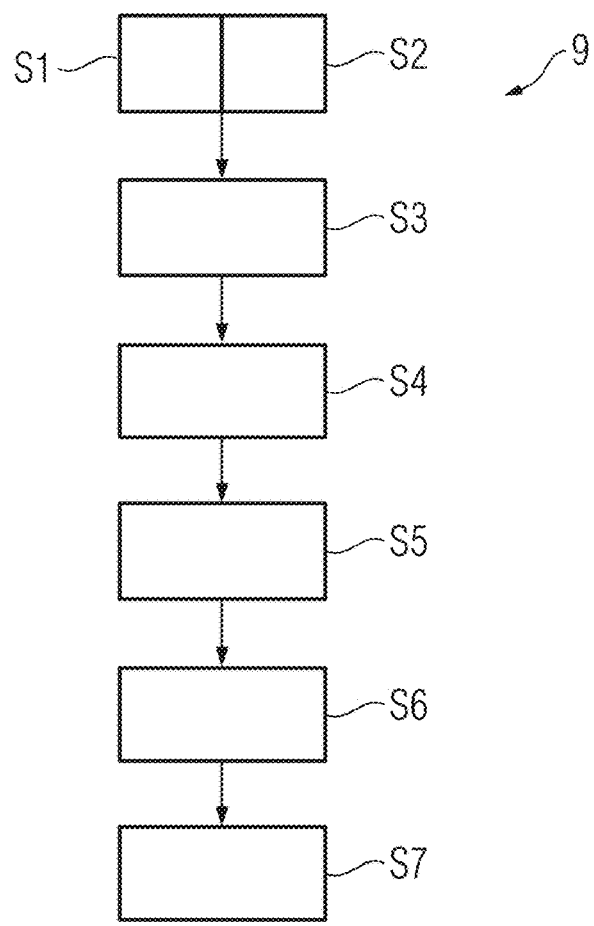
FIG. 2 illustrates an example of generating a quantitative parameter map by means of a magnetic resonance unit, in accordance with various embodiments of the present disclosure.

FIG. 2 shows a schematic flow diagram 9 for such a method. The method steps S1 to S7 indicated therein can represent, for example, corresponding functions, function blocks, function modules, program modules or suchlike in the corresponding computer program, which can be stored in the data memory 7 and executed by means of the processor 6.

In the present example, the method for the improved determination of the fat composition of the patient 2 is provided on multi-echo GRE measurements on the patient 2. Information about a relative degree of saturation of fatty acids in human fat tissue can yield information about the fat metabolism and be valuable, for example, in order, for instance, to be able to differentiate different non-alcoholic fatty liver diseases (NAFLDs) from one another.

The degree of saturation of fatty acids can be determined by means, for example, of magnetic resonance imaging or magnetic resonance tomography in the form of spatially resolved parameter maps, which may be independent of the respective MR protocol used. Such parameter maps can be calculated from corresponding multi-echo acquisitions of the MR data due to the different spectral properties of the fatty acids at a different degree of saturation—at least insofar as the acquired MR data has a sufficiently high spectral resolution and a sufficiently high signal-noise ratio.

In method step S1, for modelling the properties of the tissue of the patient 2 or modelling a corresponding MR response signal, a corresponding signal model is provided, presently for example, by the MR signal Eqn. 1, which is reproduced below:

$$S_q(t_n)=(W_q+c(ndb_q,nmidb_q,t_n)F_q)e^{i\phi_q(t_n)}e^{-R_{2,q}^*t_n},$$

as explained above. This signal model or this signal equation can be loaded into the data memory 7, for example.

In method step S2, the MR data for the patient 2 is recorded by means of the MR unit 1, in the present case by means of a multi-echo GRE sequence. Here, corresponding MR data could equally well be recorded by the data processing facility 5, for example retrieved from a different storage facility. Multi-echo magnetic resonance methods advantageously allow a non-invasive determination of a fatty acid composition (FAC). The potential problem with this, however, can be that corresponding methods have a sensitive reaction to phase errors, due for example to gradient inaccuracies and eddy current effects. In Cartesian multi-echo magnetic resonance methods, which use bipolar readout gradients, such phase errors can be modeled in the image domain, that is, in the image space, by means of spatially varying phase discrepancies between even and uneven echoes. Such models do not, however, take into account potential phase discrepancies between echoes with the same readout polarity. Therefore, by means of the method embodiments disclosed here, an FAC quantification that uses an echo-dependent phase discrepancy map is proposed.

In method step S3, the data processing facility 5 first reconstructs by means of conventional MR image reconstruction methods at least one MR image from the acquired MR data. From the MR data or from the reconstructed MR image, individual parameter maps are then calculated by the data processing facility 5 for use in the signal model, e.g. the transverse, relaxation map $R_{2,q}^*$ and the time- or echo-dependent phase evolution map $\phi_q(t_n)$.

In method step S4, an image region that is relevant or needs to be considered, that is to be evaluated, here is divided up or dissected into a plurality of pixel fields (patches) of a specified size. These pixel fields can each encompass, for example, around 50 pixels, yet in principle, any other suitable sizes can be likewise usable. The size of the pixel fields used can be selected, for example, as a function of a number of echoes, of a number of parameters in the signal model, of an available computing capacity or computing time for the signal model and/or suchlike.

In method step S5, the specified signal model is adjusted to the acquired MR data using the calculated individual parameter maps. Here, the parameters in the signal model are assumed to be or set as equal for all pixel fields, i.e. as of equal value in each case, for all the pixels in the respective pixel field. Here, the parameters can be, for example, fractions of fatty acids and relaxation on respective signals but can equally well be system parameters, such as, for instance, a phase offset, a field inhomogeneity or phase differences between echoes of different polarity and/or suchlike.

To adjust the signal model to the MR data, a least squares method can be used, for example, to minimize a corresponding cost function. In principle, a separate value would be provided for each pixel for each parameter, as a result of which a number of parameters that is not practicably manageable would be the result. Here, these individual parameters or values are connected or coupled together, however, through the cost function and the equating on a pixel basis or common evaluation that is provided here, such that overall a stable adjustment of the signal model can be carried out.

Here, use is therefore made of the fact that, spatially, phase variations or variations in the phase evolutions only vary slightly and can thus be assumed in each case to be equal or constant within a pixel field. In other words, the parameters in the signal model are therefore estimated on a pixel field basis, with for example a least squares function for a difference between the MR data and the signal model being able to be totaled up for all the pixels or voxels $q \in U_i$ for one of the pixel fields U in each case and then minimized, for example optimized using an L-BFGS optimizer. It is assumed here that the phase evolution map $\phi_q(t_n)$ is smooth at least on the scale of each pixel field U, and therefore is of lower resolution than the MR data that has been acquired. Therefore, a corresponding multi-resolution approach can be selected, and it can be assumed that within each pixel field U the following Equation 2 below applies:

$$t:\phi_q(t_n)=\phi(t_n).\qquad\text{Eqn. 2:}$$

In method step S6, the corresponding adjusted signal model is then calculated or evaluated in order to generate the quantitative parameter map. For example, values can be calculated for SFAs, MUFAs and PUFAs.

In method step S7, the parameter map can then, as described, be stored in the data memory 7 for instance and/or issued by means of the display 8.

The method described here can therefore be carried out using the installations in the MR unit 1 and can therefore be conceived as an operating method for the MR unit 1, that is, as a method for operating the MR unit 1. It is therefore possible for some of the method steps described to likewise be at least partly carried out in different sequences than those described here or in parallel with one another. In other words, other implementations of the concept underlying the method embodiments as described herein are equally possible.

Figure 3:
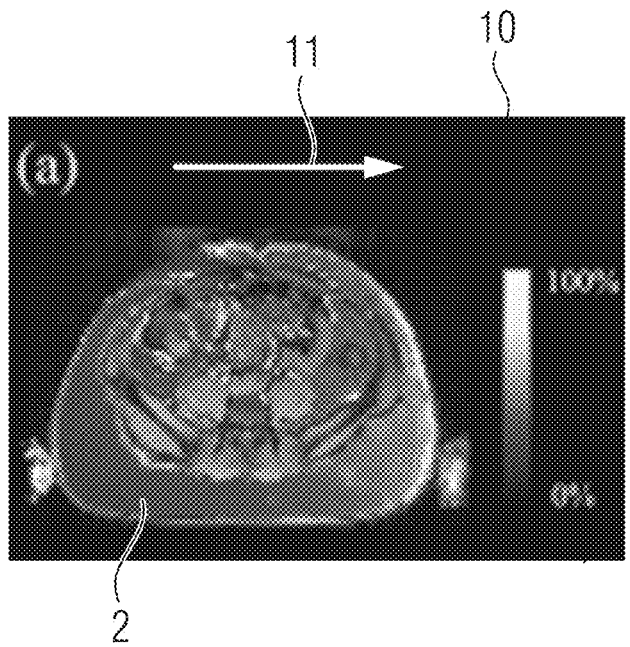
FIG. 3 illustrates a conventional fat map.

FIG. 3 shows by way of example a conventional fatty acid map 10 for SFAs in the abdominal region, of the patient 2, for example. A readout facility 11 used is indicated here by an arrow. It can be seen here that the conventional method used for generating the conventional fatty acid map 10 leads to a gradient of average intensity in the readout direction 11. As a result, regions lying further to the right appear to have a higher intensity than regions lying further to the left, which does not reflect a respective physiological reality, however, and therefore can contribute to misdiagnoses.

Figure 4:
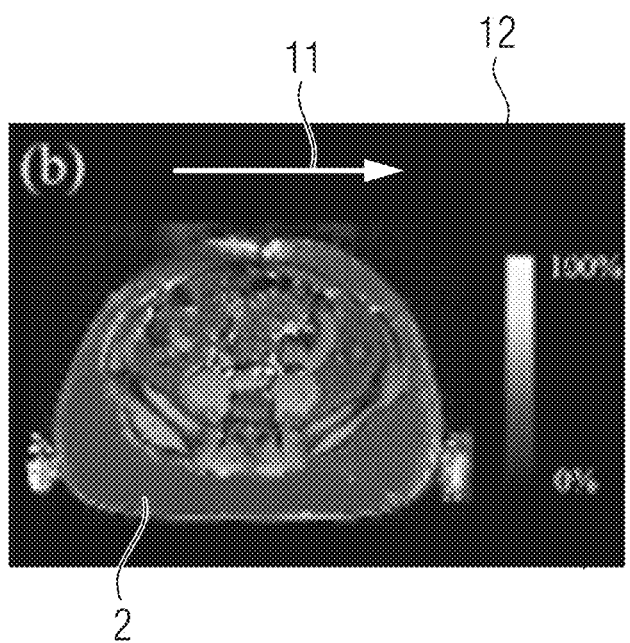
FIG. 4 illustrates an example a fat map, in accordance with various embodiments of the present disclosure.

FIG. 4 shows an example fatty acid map 12 generated according to various embodiments of the method described herein for the same image region as the conventional fatty acid map 10 from FIG. 3. The same readout direction 11 was also used for the fatty acid map 12 shown in FIG. 4. The methodology proposed here of modelling the phase errors leads to an improved consistency of the fatty acid map 12 in particular in the readout direction 11 compared with the conventional fatty acid map 10 from FIG. 3, which is based on conventional techniques. The fatty acid map 12 shown in FIG. 4 therefore better reflects the physiological reality.

Figure 5:
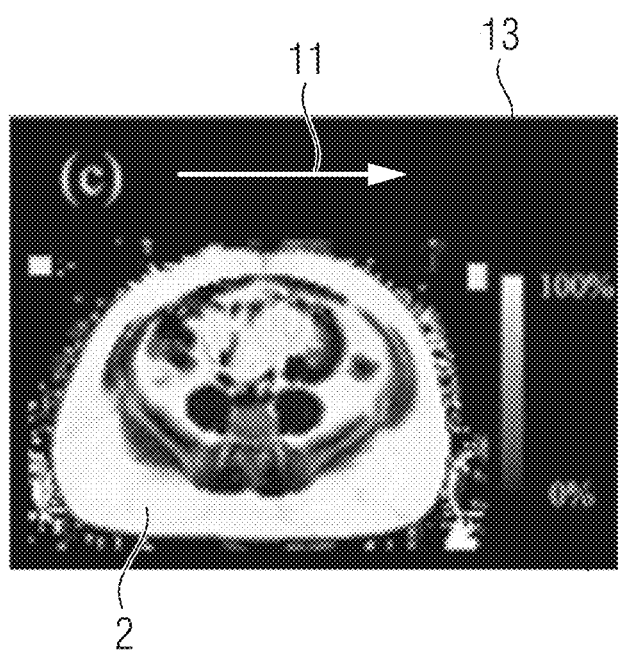
FIG. 5 illustrates an example fat fraction map, in accordance with various embodiments of the present disclosure.

FIG. 5 likewise shows a fat fraction map 13 for the same image region, which map has likewise been generated according to various embodiments of the method proposed here. As in FIG. 4, in the fatty acid map 12, the fat fraction map 13 in FIG. 5 has a reduced variability compared with fat fraction maps generated in a conventional manner, in particular in the readout direction 11.

Figure 6:
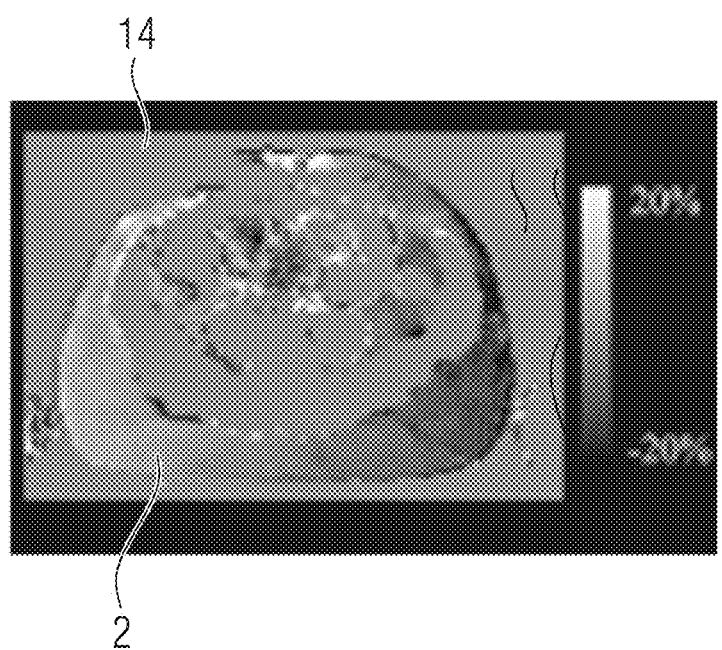
FIG. 6 illustrates an example difference image between the fat maps from FIG. 3 and FIG. 4, in accordance with various embodiments of the present disclosure.

FIG. 6 shows a difference image 14, which indicates a difference between the conventional fatty acid map 10 and the fatty acid map 12. It can be clearly seen that the difference image 14 has a structure, with a right-hand side (in the image facing the scale) being emphasized. This not only means that there is a difference between the conventional fatty acid map 10 and the fatty acid map 12, and therefore between the corresponding underlying methods, but that this difference is dependent on the readout direction 11.

In total, the examples described here show how an improved quantitative signal modelling can be facilitated for MR imaging.

What is claimed is:

1. A method for generating a quantitative parameter map from magnetic resonance (MR) data that characterizes an examination subject, comprising:
    acquiring, using a multi-echo sequence, the MR data;
    calculating, via one or more processors, a signal model that models an MR response signal relating to the examination subject, the signal model containing a time-dependent phase evolution map that is calculated from the acquired MR data and specifies a respective separate phase evolution for at least three echoes of the multi-echo sequence;
    adjusting, via one or more processors, the signal model to correspond to the acquired MR data to calculate an adjusted signal model; and
    calculating, via one or more processors, the MR response signal for an image region that contains a plurality of pixels using the adjusted signal model, the image region being divided into a plurality of pixel fields, each of the plurality of pixel fields including a respective plurality of pixels,
    wherein, for each respective pixel field from among the plurality of pixel fields, at least the phase evolution for each echo associated with each of the plurality of pixels is set equal to one another to calculate the signal model.

2. The method as claimed in claim 1, wherein the phase evolution is from among a set of parameters, for each echo associated with each of the plurality of pixels, is set equal to one another to calculate the signal model, and
    wherein the set of parameters additionally includes at least one of T1-effects, T2-effects, eddy current effects, a magnetic field strength, and a field homogeneity.

3. The method as claimed in claim 1, wherein acquiring the MR data includes recording the MR data using a monopolar acquisition technique.

4. The method as claimed in claim 1, wherein the signal model models a fat composition of the examination subject, and wherein the signal model is calculated by evaluating:

$$S_q(t_n) = (W_q + c(ndb_q, nmidb_q, t_n)F_q)e^{i\phi_q(t_n)}e^{-R_{2,q}^* t_n},$$

wherein:

q denotes an index associated with a respective pixel or voxel, $t_n$ denotes a discrete echo time, $W_q$ denotes a water signal parameter value, $F_q$ denotes a fat signal-parameter value, c( . . . ) denotes a fat model expressed by saturation state parameters including a number $ndb_q$ of double bonds and a number $nmidb_q$ of methylene-interrupted double bonds, $\phi_q(t_n)$ denotes an echo time-dependent phase evolution map, and $R_{2,q}^*$ denotes a transverse relaxation map.

5. A non-transitory computer-readable medium having instructions stored thereon that, when executed by one or more processors of a magnetic resonance (MR) imager, cause the MR imager to generate a quantitative parameter map from MR data that characterizes an examination subject by:
    acquiring, using a multi-echo sequence, the MR data;
    calculating a signal model that models an MR response signal relating to the examination subject, the signal model containing a time-dependent phase evolution map that is calculated from the acquired MR data and specifies a respective separate phase evolution for at least three echoes of the multi-echo sequence;
    adjusting the signal model to correspond to the acquired MR data to calculate an adjusted signal model; and
    calculating the MR response signal for an image region that contains a plurality of pixels using the adjusted signal model, the image region being divided into a plurality of pixel fields, each of the plurality of pixel fields including a respective plurality of pixels,
    wherein, for each respective pixel field from among the plurality of pixel fields, at least the phase evolution for each echo associated with each of the plurality of pixels is set equal to one another to calculate the signal model.

6. A magnetic resonance imager configured to generate a quantitative parameter map from magnetic resonance (MR) data that characterizes an examination subject, comprising:
    a coil array configured to generate a multi-echo sequence; and
    data processing circuitry configured to:
        calculate a signal model that models an MR response relating to the examination subject, the signal model containing a time-dependent phase evolution map that is calculated from the acquired MR data and specifies a respective separate phase evolution for at least three echoes of the multi-echo sequence;
        adjust the signal model to correspond to the acquired MR data to calculate an adjusted signal model; and
        calculate the MR response signal for an image region that contains a plurality of pixels using the adjusted signal model, the image region being divided into a plurality of pixel fields, each of the plurality of pixel fields including a respective plurality of pixels,
    wherein, for each respective pixel field from among the plurality of pixel fields, at least the phase evolution for each echo associated with each of the plurality of pixels is set equal to one another to calculate the signal model.

* * * * *